(12) United States Patent
Dai et al.

(10) Patent No.: US 11,887,942 B2
(45) Date of Patent: Jan. 30, 2024

(54) PACKAGE STRUCTURE FOR POWER SUPPLY MODULE

(71) Applicant: Nanjing Silergy Micro Technology Co., Ltd., Nanjing (CN)

(72) Inventors: Ke Dai, Nanjing (CN); Jian Wei, Nanjing (CN); Jiajia Yan, Nanjing (CN)

(73) Assignee: Hefei Silergy Semiconductor Technology Co., Ltd., Hefei (CN)

( * ) Notice: Subject to any disclaimer, the term of this patent is extended or adjusted under 35 U.S.C. 154(b) by 457 days.

(21) Appl. No.: 17/098,662

(22) Filed: Nov. 16, 2020

(65) Prior Publication Data
US 2021/0159194 A1 May 27, 2021

(30) Foreign Application Priority Data
Nov. 25, 2019 (CN) .......................... 201911168634.7

(51) Int. Cl.
| | |
|---|---|
| *H01L 23/64* | (2006.01) |
| *H01L 23/49* | (2006.01) |
| *H01L 23/492* | (2006.01) |
| *H01L 23/00* | (2006.01) |
| *H01L 25/16* | (2023.01) |
| *H02M 3/158* | (2006.01) |

(52) U.S. Cl.
CPC ............ *H01L 23/642* (2013.01); *H01L 23/49* (2013.01); *H01L 23/492* (2013.01); *H01L 23/645* (2013.01); *H01L 24/16* (2013.01); *H01L 25/16* (2013.01); *H02M 3/158* (2013.01); *H01L 2224/16245* (2013.01)

(58) Field of Classification Search
CPC ..... H01L 23/642; H01L 23/49; H01L 23/492; H01L 23/645; H01L 24/16; H01L 25/16; H01L 2224/16245; H02M 3/158
See application file for complete search history.

(56) References Cited

U.S. PATENT DOCUMENTS

| | | | |
|---|---|---|---|
| 8,063,472 B2 | 11/2011 | Liu et al. | |
| 8,860,194 B2 | 10/2014 | Ma et al. | |
| 9,035,417 B2* | 5/2015 | Reusch | ............... H05K 1/0231 |
| | | | 257/E27.113 |
| 9,077,335 B2* | 7/2015 | Hughes | ............... H01L 23/5385 |
| 9,159,703 B2 | 10/2015 | Cho et al. | |
| 9,627,972 B2 | 4/2017 | Mao et al. | |

(Continued)

FOREIGN PATENT DOCUMENTS

CN 108878297 A 11/2018

*Primary Examiner* — Peniel M Gumedzoe

(57) ABSTRACT

A package structure for a power supply module, can include: a die and a capacitive element that are separated from each other and arranged on different horizontal planes with different heights along a vertical direction of the package structure; connection structures that connect to the die and to the capacitive element; where a current loop comprising at least two parallel current paths on different horizontal planes with different heights along the vertical direction of the package structure is formed; and where the current loop passes through the die, the capacitive element, and the connection structures, and directions of currents of the two parallel current paths are at least partially opposite to each other in order to decrease electromagnetic interference.

19 Claims, 12 Drawing Sheets

(56) References Cited

U.S. PATENT DOCUMENTS

| | | |
|---|---|---|
| 9,698,701 B2 | 7/2017 | Li |
| 9,780,081 B2 | 10/2017 | Tan |
| 11,387,179 B2* | 7/2022 | Shibuya ............ H01L 23/49811 |
| 2010/0133674 A1* | 6/2010 | Hebert .............. H01L 23/49562 |
| | | 438/109 |

* cited by examiner

PACKAGE STRUCTURE FOR POWER SUPPLY MODULE

RELATED APPLICATIONS

This application claims the benefit of Chinese Patent Application No. 201911168634.7, filed on Nov. 25, 2019, which is incorporated herein by reference in its entirety.

FIELD OF THE INVENTION

The present invention generally relates to the field of power electronics, and more particularly to package structures for power supply modules.

BACKGROUND

In many applications, module power supplies need to meet electromagnetic compatibility conduction and radiation standards. However, due to the relatively small size and simple structure of module power supplies, it can be difficult to integrate a complex filter system in order to improve electromagnetic interference characteristics. Therefore, it is particularly important to reduce electromagnetic interference by effectively suppressing the noise source.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
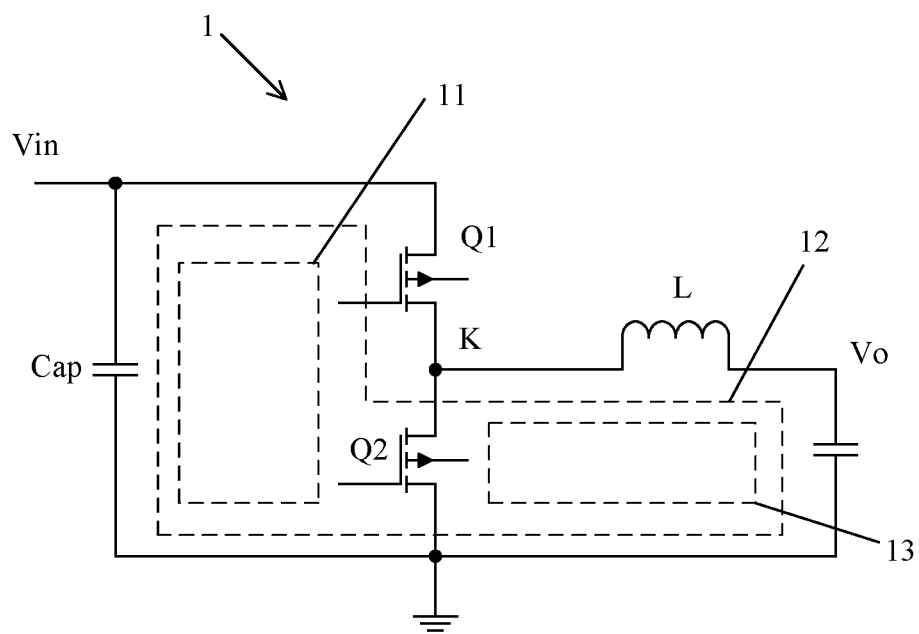
FIG. 1 is a schematic diagram of an example buck switching converter.

Referring now to FIG. 1, shown is a schematic diagram of one example buck switching converter. In this particular example, the buck switching converter can include capacitive element Cap, power element Q1, power element Q2, and inductance element L. An input end of the buck switching converter, capacitive element Cap, power elements Q1 and Q2, inductance element L, and an output end of the buck switching converter, can form current loops 11-13. Current loops 11-13 can generate parasitic inductance, and particularly the parasitic inductance generated by current loop 11 can be directly used as a noise source to affect the waveform of the voltage at intermediate node K. That is, current loop 11 is the main generation path of the noise source in the buck switching converter.

Figure 2:
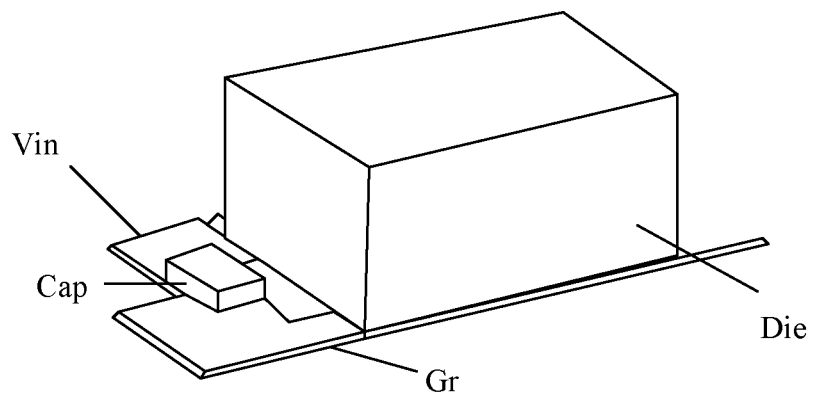
FIG. 2 is a schematic diagram of an example package structure for a power supply module.

Referring now to FIG. 2, shown is a schematic diagram of an example package structure for a power supply module. In this example package structure for the power supply module, power elements Q1 and Q2 are integrated within a die, and capacitive element Cap can be placed near the die (as shown in FIG. 2), or may be included in the die in order to reduce parasitic inductance, and thereby reducing noise. In this particular example, the current flows from input voltage pad Vin to the die through capacitive element Cap, then flows to ground layer Gr through the contact pad connected to the ground potential on the die, and finally flows to capacitive element Cap to form a current loop. However, the current of the current loop passes through the die laterally, and when the path which the current flows through is longer, then the area of the current loop is larger, and as such the parasitic inductance generated by the current loop is larger. In addition, capacitive element Cap, the die, and other elements forming the current loop may essentially be located on the same plane. Thus, the current loop is horizontal, and the magnetic fields generated inside and outside the loop current may not be offset. As such, the parasitic inductance may remain large and the noise of the output voltage also large.

In particular embodiments, a package structure for a power supply module is provided such that the magnetic fields outside the loop current formed by the energy storage element, the die with the power element integrated therein, and the ground layer can cancel each other out, thereby reducing the parasitic inductance generated by the current loop, and reducing the noise. In one embodiment, the package structure can include: a die and a capacitive element, arranged on different horizontal planes with different height along a vertical direction of the package structure and being separated from each other; connection structures, arranged to connect to the die and the capacitive element; where a current loop comprising at least two parallel current paths on different horizontal planes with different height along the vertical direction of the package structure is formed, and passes through the die, the capacitive element and the connection structures; and where directions of currents of the two parallel current paths are at least partially opposite to decrease electromagnetic interference.

In particular embodiments, a length of the two parallel current paths may be greater than a space between the two parallel current paths to make magnetic fields outside the current loop cancel each other out. The package structure can also include a ground layer arranged to be parallel to the die, where connection structures may form electrical connections between the die and the ground layer, and electrical connections between the capacitive element and the ground layer. The die can be arranged on one surface of the ground layer, an input voltage pad can connect to corresponding contact pads on an active surface of the die through corresponding conductive bumps, and can connect to a positive terminal of the capacitive element through corresponding connection structures. Also, a ground potential pad can connect to corresponding contact pads on the active surface of the die through corresponding conductive bumps, and can connect to the ground layer through corresponding connection structures. Further, a negative terminal of the capacitive element can connect to the ground layer. For example, a negative terminal of the capacitive element may be directly connected to the ground layer, or a negative terminal of the capacitive element can connect to the ground layer through corresponding connection structures.

For example, the die, the capacitive element, the connection structures, and the ground layer may form two current transmission media, and directions of currents of current paths of the two current transmission media are opposite, and the two current transmission media may be on different horizontal planes. The two current transmission media can be parallel to each other along the vertical direction of the package structure. In one embodiment, the package structure can include: a die including at least one power element; an energy storage element; a ground layer; and a plurality of connection structures configured to make electrical connections between the power element, the energy storage element, and the ground layer. The die, the energy storage element, the connection structures, and the ground layer can form a current loop so that the current loop has two current paths parallel to each other, where the directions of currents of the two parallel current paths are at least partially opposite to make the magnetic fields outside the current loop can cancel each other out. For example, the die, the energy storage element, the connection structures, and the ground layer may form two current transmission media, and the directions of currents of current paths of the two current transmission media are opposite, where the two current transmission media are on different horizontal planes. For example, the two current transmission media can be parallel to each other. For example, the two current transmission media may be parallel to each other along the thickness direction of the package structure (i.e., in the vertical direction of the package structure). In particular embodiments, the energy storage element can be a capacitive element, and the two current transmission media may include first and second current transmission mediums.

Figure 3:
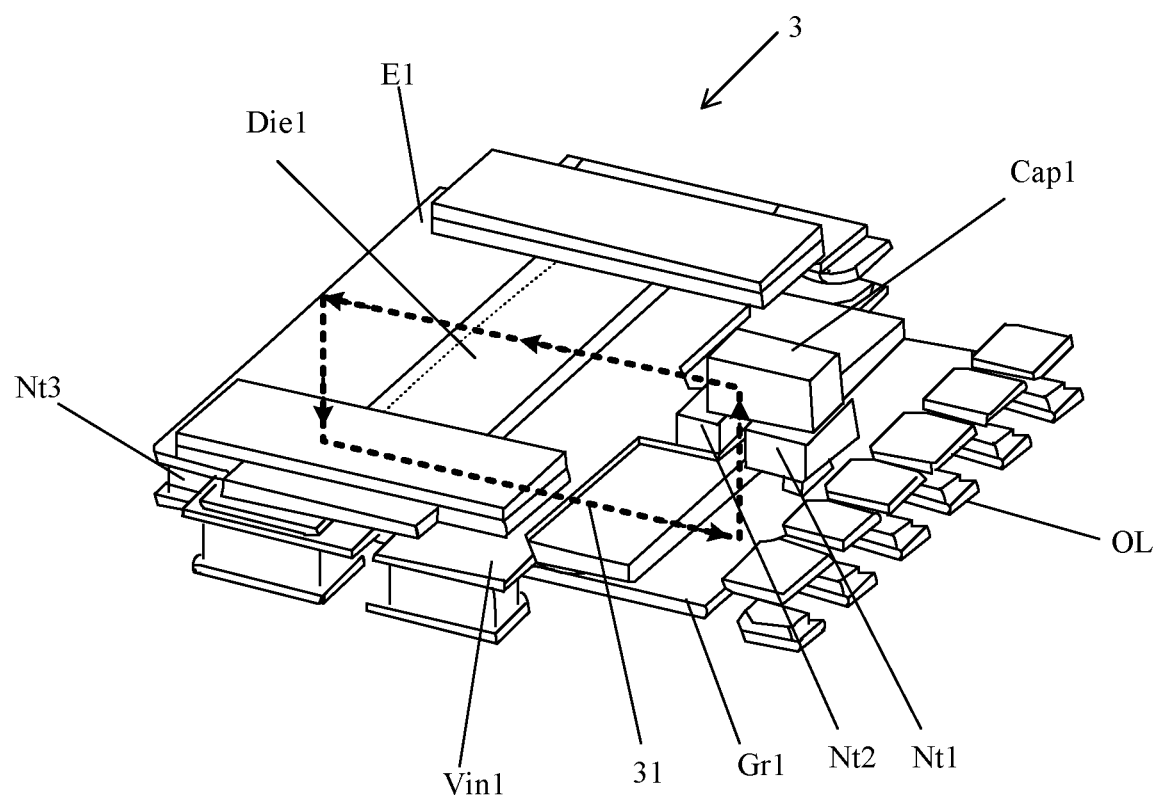
FIG. 3 is a schematic diagram of an example package structure for a power supply module, in accordance with embodiments of the present invention.
Figure 4:
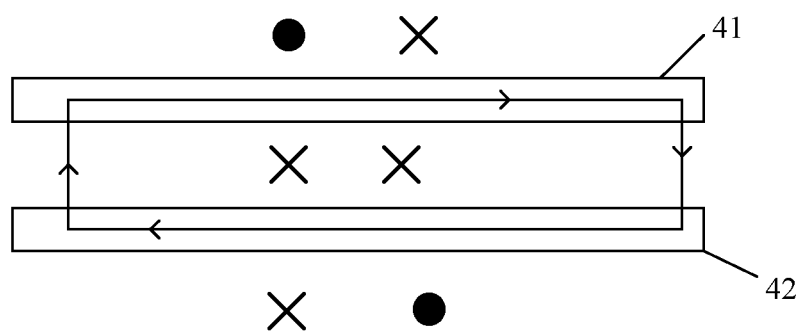
FIG. 4 is an equivalent schematic diagram of a current loop of the power supply module, in accordance with embodiments of the present invention.

Referring now to FIG. 3, shown is a schematic diagram of a package structure for a power supply module, in accordance with embodiments of the present invention. Referring also to FIG. 4, shown is an equivalent schematic diagram of a current loop of the power supply module, in accordance with embodiments of the present invention. In FIG. 3, package structure 3 for the power supply module can include die D1, energy storage element Cap1, connection structures Nt1-Nt3, and ground layer Gr1. Input voltage pad Vin1 may be in contact with the conductive bumps of the corresponding contact pads on the active surface of die D1, ground potential pad E1 can be in contact with the conductive bumps of the corresponding contact pads on the active surface of die D1. Also, energy storage element Cap1 can be electrically connected to ground layer Gr1 through connection structure Nt1, and maybe connected to input voltage pad Vin1 through connection structure Nt2.

For example, die D1 can contact the metal layer of input voltage pad Vin1 through the conductive bumps on its active surface, and may contact the metal layer of ground potential pad E1 through the conductive bumps on its active surface. Also, the back surface of die D1 (e.g., the non-active surface) may be bonded to ground layer Gr1 through an adhesive layer. Ground potential pad E1 can connect to ground layer Gr1 through connection structure Nt3. Thus, energy storage element Cap1, die D1, connection structures Nt1-Nt3, and ground layer Gr1 may form current loop 31. For example, current loop 31 starts from energy storage element Cap1, and sequentially passes through die D1 and ground layer Gr1, and finally returns to energy storage element Cap1. FIG. 4 shows the equivalent schematic diagram of current loop 31. For example, connection structures Nt1-Nt3 can be bonding wires or metal bumps, which may make electrical connections between the die, the energy storage element, the input power source (e.g., coupled to input voltage pad Vin1), and the ground layer.

Current loop 31 formed by die D1, energy storage element Cap1, connection structures Nt1-Nt3, and ground layer Gr1 may have two parallel current paths, and the directions of currents of the two parallel current paths can be opposite to make the magnetic fields outside current loop 31 in order cancel each other out. For example, current loop 31 may have two parallel current paths on different horizontal planes with different height along the thickness direction of package structure 3 of the power supply module. For example, in the thickness direction of package structure 3, die D1, energy storage element Cap1, and ground layer Gr1 can form two current transmission media. The two current transmission media can be approximately two parallel plate structures 41 and 42, and the directions of currents of the current paths of two parallel plate structures 41 and 42 may be opposite to make the magnetic fields outside current loop 31 cancel each other out. The parallel plate structures 41 and 42 can be separated from each other, such that the magnetic fields generated by current loop 31 may only remain in the space between the parallel plate structures 41 and 42.

In addition, as shown in FIG. 3, the thickness of die D1 is relatively small, and the space between the two parallel plate structures 41 and 42 formed by die D1, energy storage element Cap1, and ground layer Gr1 is relatively small, so the energy storage of the space is also small, and the parasitic inductance generated by the current loop can be reduced. For example, the relative distance or space between the two parallel plate structures 41 and 42 may be related to the thickness of die D1. The smaller thickness of die D1 is, the smaller the relative distance between the two parallel plate structures 41 and 42, and the smaller parasitic inductance of current loop 31. For example, the relative distance between the two parallel plate structures 41 and 42 can be limited to between about 150 um and about 250 um.

For example, package structure 3 can also include outer pins OL located at the bottom of package structure 3, and outer pins OL can be used to connect to other components. Also for example, the package structure can include inductance element L (not shown in FIG. 3), where inductance element L can connect between intermediate node of the die and the output terminal through the connection structures. The die can include two power elements, and intermediate node may be a common end of the two power elements. For example, the energy storage element can be a capacitive element, and the power elements, capacitive element, and inductance element may form a switching converter (e.g., a buck switching converter, etc.).

In particular embodiments, the package structure can make the current loop formed by the die, the energy storage element, and the ground layer, have two parallel current paths on different horizontal planes with different height along the thickness direction of the package structure (e.g., the vertical direction of the package structure). Also, the two parallel current paths can be equivalent to the two parallel plate structures, where the directions of currents of the two parallel plate structures are basically opposite, so that the magnetic fields outside the current loop can cancel each other out, such that the parasitic inductance generated by the current loop can be reduced.

Further, the smaller distance between the two parallel plate structures, the smaller area of the current loop, so the parasitic inductance can be further reduced, and the influence of the noise source on the circuit can be reduced. For example, as viewed from the frequency domain, the current loop of the circuit may have a certain section on the die (e.g., the section between intermediate node of the two transistors in the buck switching converter and the ground potential), and the phase of the current may be different in the certain section, which can cause the current direction of that certain section to be deviated. Therefore, the directions of currents of the two parallel current paths may mostly be opposite, such that the magnetic fields outside the current loop can cancel each other out, and the parasitic inductance generated by the current loop can be reduced.

Figure 5:
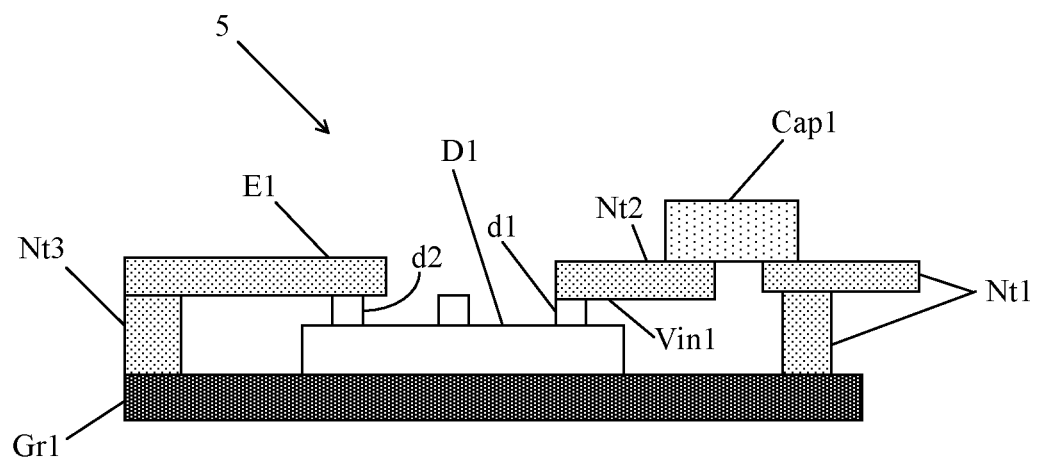
FIG. 5 is a cross-sectional view of a first example package structure for a power supply module, in accordance with embodiments of the present invention.

Referring now to FIG. 5, shown is a cross-sectional view of a package structure for a first example power supply module, in accordance with embodiments of the present invention. In this particular example, package structure 5 for the power supply module can include die D1, capacitive element Cap1, connection structures Nt1-Nt3, ground layer Gr1, and outer pins OL (not shown in FIG. 5), where die D1 can include at least one power element (e.g., power switches Q1 and Q2). For example, connection structures Nt1-Nt3 can be bonding wires or metal bumps, which may make electrical connections between the power elements, the capacitive element, the input power source, and the ground layer. Further, outer pins OL located at the bottom of package structure 5 can be used to connect other components.

In this particular example, die D1, capacitive element Cap1, ground layer Gr1 can be electrically connected through connection structures Nt1-Nt3. Die D1 can be located above ground layer Gr1, the active surface of die D1 may be provided with conductive bumps connected to the contact pads, such as conductive bumps d1 and d2. The back surface of die D1 (e.g., the non-active surface) can be bonded to a first surface of ground layer Gr1 through an adhesive layer (not shown in FIG. 5). The active surface of die D1 may be opposite to the back surface of die D1, and the first surface of ground layer Gr1 can be opposite to a second surface of ground layer Gr1. Die D1 can be electrically connected to input voltage pad Vin1 through conductive bump d1, and maybe electrically connected to ground potential pad E1 through conductive bump d2. Also, ground potential pad E1 can be electrically connected to ground layer Gr1 through connection element Nt3. One end of capacitive element Cap1 may be electrically connected to ground layer Gr1 through connection element Nt1, and can be electrically connected to input voltage pad Vin1 through connection element Nt2.

Figure 6:
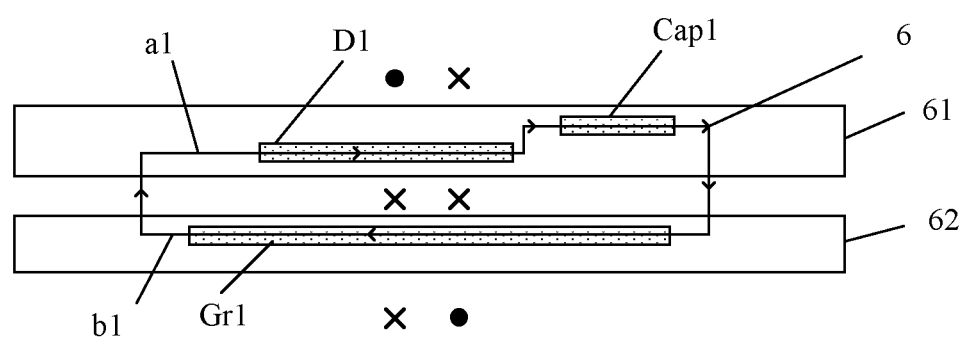
FIG. 6 is an equivalent schematic diagram of a current loop of the power supply module for the first example, in accordance with embodiments of the present invention.

Referring now to FIG. 6, shown is an equivalent schematic diagram of a current loop of the power supply module of the first example, in accordance with embodiments of the present invention. In this particular example, die D1, capacitive element Cap1, and ground layer Gr1 can form current loop 6, and current loop 6 may have two substantially parallel current paths. For example, die D1 and capacitive element Cap1 may be configured as first current transmission medium a1, and ground layer Gr1 may be configured as second current transmission medium b1. Further, first and second current transmission mediums a1 and b1 can be parallel to each other. For example, in the thickness direction of the package structure 5, first and second current transmission mediums a1 and b1 can be parallel to each other, and the directions of the current flowing through first and second current transmission mediums a1 and b1 may be opposite.

Therefore, the two current transmission media of current loop 6 in this example can approximately be equivalent to parallel plate structures 61 and 62, and the directions of the current flowing through parallel plate structures 61 and 62 may be opposite, such that the magnetic fields outside current loop 6 can cancel each other out according to Ampere's loop theorem. In addition, the current in the vertical direction mainly flows from the active surface of die D1 to ground layer Gr1, and the thickness of die D1 is relatively small, so the distance of the space between parallel plate structure 61 and parallel plate structure 62 (that is, the length of the current path in the vertical direction) is relatively short. Therefore, the energy storage of the magnetic field inside current loop 6 can be relatively small, and the package structure of the power supply module in this example may have a relatively small parasitic inductance, which can reduce the influence of noise sources on the circuit.

Figure 7:
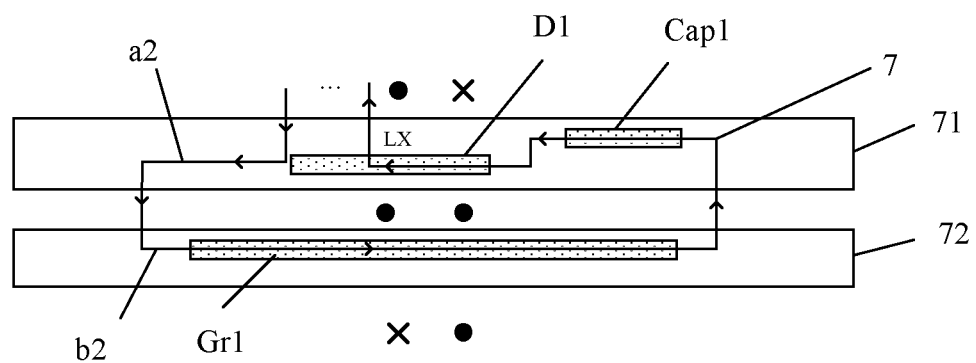
FIG. 7 is an equivalent schematic diagram of another current loop of the power supply module for the first example, in accordance with embodiments of the present invention.

Referring now to FIG. 7 is an equivalent schematic diagram of another current loop of the power supply module in the first example, in accordance with embodiments of the present invention. For example, package structure 5 can also include inductance element L (not shown in FIG. 5), where inductance element L is electrically connected to the conductive bumps located at intermediate node of die D1. Die D1 can include power elements Q1 and Q2, where the intermediate node is a common end of power elements Q1 and Q2. In this example, input voltage pad Vin1, capacitive element Cap1, inductance element L, and power elements Q1 and Q2 may form a switching converter, such as a buck switching converter.

For example, die D1, capacitive element Cap1, connection structures Nt1-Nt3 (not shown in FIG. 7), inductance element L (not shown in FIG. 7), and ground layer Gr1 can form current loop 7. The current path of current loop 7 is: input terminal-power element Q1 (electrically connected to conductive bump d1)-intermediate node of die D1-inductance element L-output terminal-ground terminal-capacitive element Cap1-input terminal. Current loop 7 has two substantially parallel current paths. For example, die D1 and capacitive element Cap1 can be configured as first current transmission medium a2, and ground layer Gr1 can be configured as second current transmission medium b2, so the two current transmission media of current loop 7 may approximately be equivalent to parallel plate structures 71 and 72. The distance of the space between the current path flowing out of parallel plate structure 71 from intermediate node of die D1 and the current path flowing back to parallel plate structure 71 is relatively short, so the overall current in parallel plate structure 71 can be regarded as flowing from the right end to the left end of parallel plate structure 71. The overall current in parallel plate structure 72 may be regarded as flowing from the left end to the right end of parallel plate structure 72. That is, in the current loop 7, the directions of the current flowing through parallel plate structures 71 and 72 are basically opposite, so the magnetic fields outside current loop 7 can effectively cancel each other out.

It should be noted that FIG. 7 is only a simple equivalent diagram. In fact, the current in the vertical direction mainly flows from the active surface of die D1 to ground layer Gr1, and the thickness of die D1 is relatively small, so the distance of the space between parallel plate structure 71 and parallel plate structure 72 (that is, the length of the current path in the vertical direction) is very short. Therefore, the energy storage of the magnetic field inside current loop 7 is relatively small, and the package structure of the power supply module in this example has a small parasitic inductance, which can reduce the influence of the noise source on the circuit. It should also be noted that the parallel plate structures in FIGS. 6 and 7 is only to facilitate the description of the principle that the package structure of the power supply module can reduce parasitic inductance. In addition, the parallel plate structures in FIGS. 6 and 7 are only equivalent structures based on the positions of multiple connection structures, the die, the capacitive element, and the ground layer in the package structure and the current paths of the current loop formed by multiple connection structures, the die, the capacitive element, and the ground layer, rather than the specific structures in the package structure.

In particular embodiments, the die, the energy storage element, the ground layer, and connection structures of the package structure may form a current loop, where the current loop have two parallel current paths, and the directions of currents of the two parallel current paths are opposite to make the magnetic fields outside the current loop can cancel each other out, such that the parasitic inductance generated by the current loop can be reduced, and influence of the noise source on the circuit can be reduced.

Figure 8:
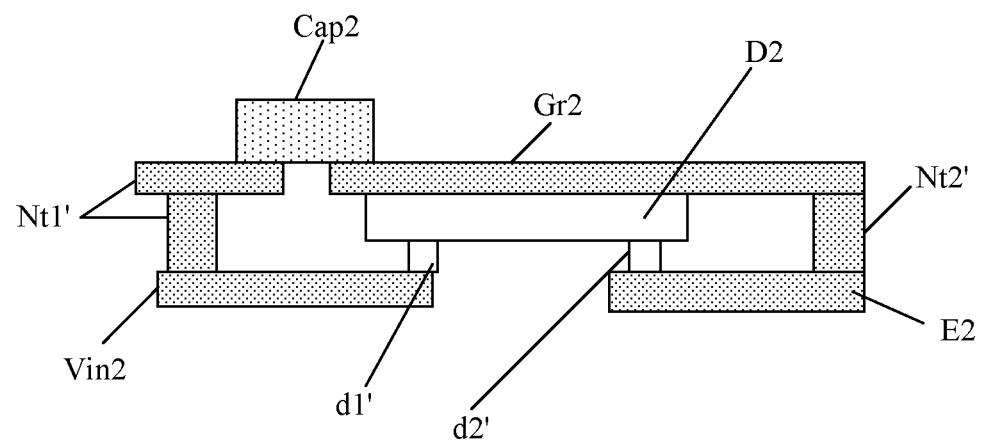
FIG. 8 is a cross-sectional view of a second example package structure for a power supply module, in accordance with embodiments of the present invention.

Referring now to FIG. 8, shown is a cross-sectional view of a package structure for a power supply module, in accordance with the second embodiment of the present invention. In this particular example, package structure 8 for the power supply module can include die D2, capacitive element Cap2, connection structures Nt1' and Nt2', ground layer Gr2, and outer pins OL' (not shown in FIG. 8), where die D2 can include at least one power element (e.g., power switches Q1 and Q2). For example, connection structures Nt1' and Nt2' can be bonding wires or metal bumps, which may make electrical connections between the die, the capacitive element, the input power source, and the ground layer. Outer pins OL' located at the bottom of package structure 8 can be used to connect other components.

In this example, die D2, capacitive element Cap2, ground layer Gr2 can be electrically connected through connection structures Nt1' and Nt2'. Die D2 can be located under the ground layer Gr2, and capacitive element Cap2 may be located above ground layer Gr2. The active surface of die D2 may be provided with conductive bumps connected to the contact pads, such as conductive bumps d1' and d2'. The back surface of die D2 (e.g., the non-active surface) can be bonded to the first surface of ground layer Gr2 through an adhesive layer (not shown in FIG. 8), and capacitive element Cap2 can be connected to the second surface of ground layer Gr2, where the conductive bumps of the active surface of die D2 are relatively far away from capacitive element Cap2. The active surface of die D2 can be opposite to the back surface of die D2, and the first surface of ground layer Gr2 may be opposite to the second surface of ground layer Gr2. Die D2 can be electrically connected to input voltage pad Vin2 through conductive bump d1', and may be electrically connected to ground potential pad E2 through conductive bump d2'. Also, ground potential pad E2 can be electrically connected to ground layer Gr2 through connection element Nt2'. Capacitive element Cap2 may be electrically connected to input voltage pad Vin2 through connection element Nt1'.

Figure 9:
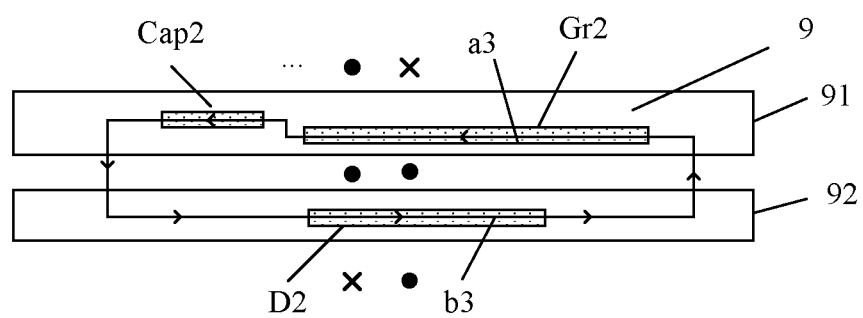
FIG. 9 is an equivalent schematic diagram of a current loop of the power supply module for the second example, in accordance with embodiments of the present invention.

Referring now to FIG. 9, shown is an equivalent schematic diagram of a second example current loop of the power supply module, in accordance with embodiments of the present invention. In this particular example, die D2, capacitive element Cap2, connection structures Nt1' and Nt2', and ground layer Gr2 can form current loop 9, and current loop 9 may have two substantially parallel current paths. Here, capacitive element Cap2 and ground layer Gr2 can be configured as first current transmission medium a3, and die D2 can be configured as second current transmission medium b3. Further, first and second current transmission mediums a3 and b3 may be parallel to each other. For example, in the thickness direction of the package structure 8, first and second current transmission mediums a3 and b3 are parallel to each other, and the directions of the current flowing through first and second current transmission mediums a3 and b3 can be opposite. Therefore, the two current transmission media of current loop 9 in this example can approximately be equivalent to parallel plate structures 91 and 92, and the directions of the current flowing through parallel plate structures 91 and 92 may be opposite, such that the magnetic fields outside current loop 9 can cancel each other out according to Ampere's loop theorem.

In addition, the current in the vertical direction mainly flows from the active surface of die D2 to ground layer Gr2, and the thickness of die D2 is relatively small, so the distance of the space between parallel plate structures 91 and 92 (that is, the length of the current path in the vertical direction) is relatively short. Therefore, the energy storage of the magnetic field inside current loop 9 may be relatively small, and the package structure of the power supply module in this example may have a relatively small parasitic inductance, which can reduce the influence of the noise source on the circuit. For example, the distance between parallel plate structures 91 and 92 may be determined by the thickness of the die.

Figure 10:
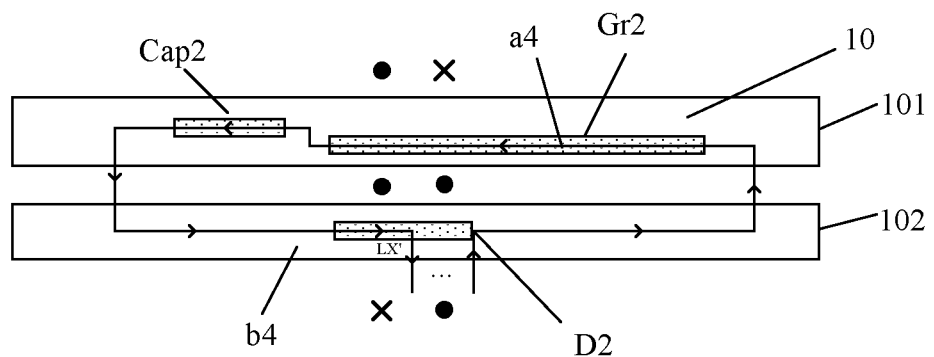
FIG. 10 is an equivalent schematic diagram of another current loop of the power supply module for the second example, in accordance with embodiments of the present invention.

Referring now to FIG. 10 is an equivalent schematic diagram of another current loop of the power supply module in the second example, in accordance with embodiments of the present invention. In this particular example, package structure 8 can include inductance element L' (not shown in FIG. 8), where inductance element L' can be electrically connected to the conductive bumps located at intermediate node of die D2. Die D2 may include (e.g., integrated therein) power elements Q1' and Q2', and intermediate node can be a common end of power elements Q1' and Q2'. In this example, input voltage pad Vin2, capacitive element Cap2, inductance element L', and power elements Q1' and Q2' can form a switching converter, such as a buck switching converter.

In this example, die D2, capacitive element Cap2, connection structures Nt1' and Nt2' (not shown in FIG. 10), inductance element L' (not shown in FIG. 10), and ground layer Gr2 can form current loop 10. The current path of current loop 10 is: input terminal-power element Q1' (electrically connected to conductive bump d1')-intermediate node of die D2-inductance element L'-output terminal-ground terminal-capacitive element Cap2-input terminal. Current loop 10 may have two substantially parallel current paths, where capacitive element Cap2 and ground layer Gr2 are configured as first current transmission medium a4, and die D2 is configured as second current transmission medium b4, so the two current transmission media of current loop 10 can approximately be equivalent to parallel plate structures 101 and 102. The distance of the space between the current path flowing out of parallel plate structure 102 from intermediate node of die D2 and the current path flowing back to parallel plate structure 102 may be relatively short, so the overall current in parallel plate structure 102 can be regarded as flowing from the left end to the right end of parallel plate structure 102.

The overall current in parallel plate structure 101 may be regarded as flowing from the right end to the left end of parallel plate structure 101. That is, in the current loop 10, the directions of the current flowing through parallel plate structures 101 and 102 can essentially be opposite, such that the magnetic fields outside current loop 10 can cancel each other out. In addition, the current in the vertical direction mainly flows from the active surface of die D2 to ground layer Gr2, and the thickness of die D2 is relatively small, so the distance of the space between parallel plate structures 101 and 102 (that is, the length of the current path in the vertical direction) is relatively short. Therefore, the energy storage of the magnetic field inside current loop 10 is relatively small, and the package structure of the power supply module in this example may have a relatively small parasitic inductance, which can reduce the influence of the noise source on the circuit.

It should be understood that the parallel plate structures in FIGS. 9 and 10 is only to facilitate the description of the principle that the package structure of the power supply module of this example can reduce the parasitic inductance. In addition, the parallel plate structures in FIGS. 9 and 10 are only equivalent structures based on the positions of multiple connection structures, the die, the capacitive element, and the ground layer in the package structure and the current paths of the current loop formed by multiple connection structures, the die, the capacitive element, and the ground layer, rather than the specific structures in the package structure.

Figure 11:
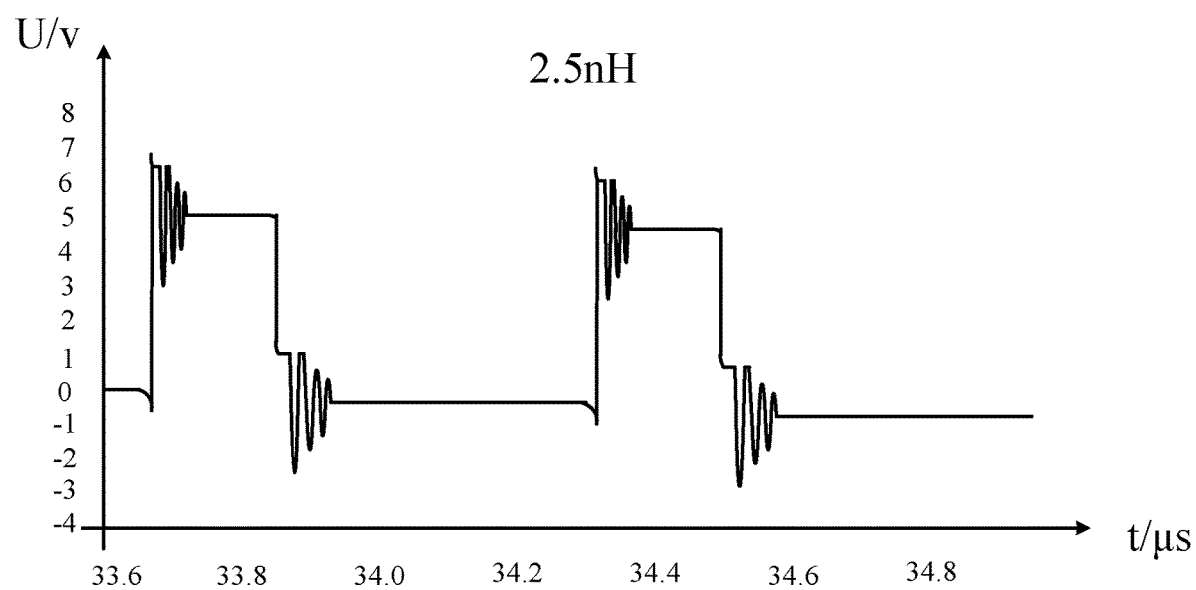
FIG. 11 is a waveform diagram of one example voltage at an intermediate node.
Figure 12:
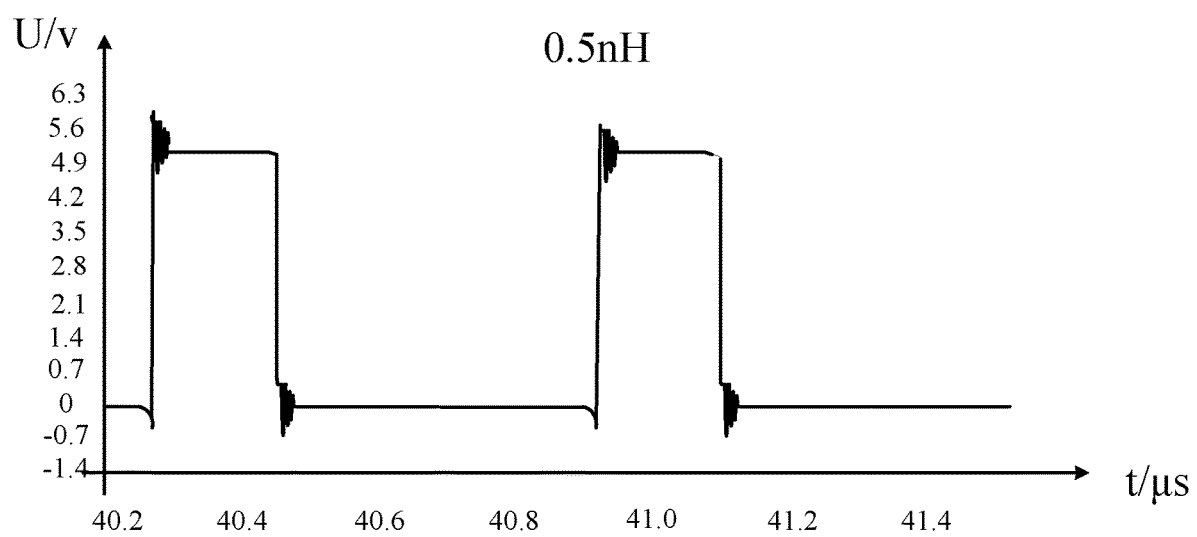
FIG. 12 is a waveform diagram of an example voltage at an intermediate node, in accordance with embodiments of the present invention.

Referring now to FIG. 11, shown is a waveform diagram of a voltage at an intermediate node. Referring also to FIG. 12, shown is a waveform diagram of a voltage at an intermediate node, in accordance with embodiments of the present invention. In both, a buck switching converter is taken as the example converter. In the package structure of the buck switching converter, power elements Q1 and Q2 are typically integrated in a die, and capacitive element Cap is placed nearby the die, or capacitive element Cap may further be integrated in the die to reduce parasitic inductance. In the example of FIG. 11, the voltage waveform of intermediate node (see, e.g., FIG. 1) of power elements Q1 and Q2 is shown, where the parasitic inductance is equal to 2.5 nH, and the noise of the voltage on intermediate node is relatively large. In particular embodiments, as shown in the example of FIG. 12, the parasitic inductance is equal to 0.5 nH, and the noise of the voltage on the intermediate node is relatively small.

In particular embodiments, the die, the energy storage element, the ground layer, and connection structures of the package structure are configured to form a current loop, where the current loop may have two parallel current paths, and the directions of currents of the two parallel current paths are opposite in order to make the magnetic fields outside the current loop cancel each other out. In this way, the parasitic inductance generated by the current loop can be reduced, and the influence of noise source(s) on the circuit can be reduced.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A package structure for a power supply module, the package structure comprising:
   a) a die and a capacitive element that are separated from each other and arranged on different horizontal planes with different heights along a vertical direction of the package structure, wherein the die is arranged on one surface of a ground layer;
   b) a plurality of connection structures that connect to the die and to the capacitive element;
   c) wherein a current loop comprising at least two parallel current paths on different horizontal planes with different heights along the vertical direction of the package structure is formed;
   d) wherein the current loop passes through the die, the capacitive element, and the plurality of connection structures, and directions of currents of the two parallel current paths are at least partially opposite to each other in order to decrease electromagnetic interference;
   e) wherein the two parallel current paths comprise a first current path that flows through the capacitive element, and a second current path that flows through the die;
   f) wherein an input voltage pad is connected to corresponding contact pads on an active surface of the die through corresponding conductive bumps, and is connected to a positive terminal of the capacitive element through corresponding of the plurality of connection structures; and
   g) wherein a ground potential pad is connected to corresponding contact pads on the active surface of the die through corresponding conductive bumps, and to the ground layer through corresponding of the plurality of connection structures.

2. The package structure of claim 1, wherein a length of the two parallel current paths is greater than a space between the two parallel current paths, in order to make magnetic fields outside the current loop cancel each other out.

3. The package structure of claim 2, wherein the plurality of connection structures are configured to form electrical connections between the die and the ground layer, and between the capacitive element and the ground layer.

4. The package structure of claim 3, wherein:
   a) the die, the capacitive element, the plurality of connection structures, and the ground layer are configured to form two current transmission media;
   b) directions of currents of current paths of the two current transmission media are opposite; and
   c) the two current transmission media are on different horizontal planes.

5. The package structure of claim 4, wherein the two current transmission media are parallel to each other along the vertical direction of the package structure.

6. The package structure of claim 1, wherein a negative terminal of the capacitive element is connected to the ground layer.

7. The package structure of claim 1, wherein a negative terminal of the capacitive element is connected to the ground layer through corresponding of the plurality of connection structures.

8. The package structure of claim 4, wherein:
 a) the two current transmission media comprise first and second current transmission mediums;
 b) the capacitive element and the die are configured as the first current transmission medium; and
 c) the ground layer is configured as the second current transmission medium.

9. The package structure of claim 4, wherein:
 a) the two current transmission media comprise first and second current transmission mediums;
 b) the capacitive element and the ground layer are configured as the first current transmission medium; and
 c) the die is configured as the second current transmission medium.

10. The package structure of claim 8, wherein a back surface of the die is coupled to the ground layer, and contact pads on an active surface of the die face the capacitive element.

11. The package structure of claim 10, wherein:
 a) the plurality of connection structures comprises first and second connection structures; and
 b) the capacitive element is electrically connected to the ground layer through the first connection structure, and to an input voltage pad through the second connection structure.

12. The package structure of claim 11, wherein:
 a) the plurality of connection structures further comprises a third connection structure; and
 b) a ground potential pad is electrically connected to the ground layer through the third connection structure.

13. The package structure of claim 9, wherein a back surface of the die is coupled to a first surface of the ground layer, and contact pads on an active surface of the die are away from the capacitive element.

14. The package structure of claim 13, wherein:
 a) the plurality of connection structures comprises a first connection structure;
 b) the capacitive element is electrically connected to the input voltage pad through the first connection structure, and to a second surface of the ground layer; and
 c) the first surface and the second surface of the ground layer are opposite.

15. The package structure of claim 1, wherein each of the plurality of connection structures are bonding wires or metal bumps.

16. The package structure of claim 4, wherein the two current transmission media are separated from each other.

17. The package structure of claim 4, wherein a relative distance between the two current transmission media is determined by a thickness of the die.

18. The package structure of claim 1, wherein:
 a) the die comprises two power elements; and
 b) the two power elements and the capacitive element are configured to form a switching converter.

19. The package structure of claim 1, wherein the package structure further comprises outer pins located at a bottom of the package structure.

* * * * *